(12) United States Patent
Nishimura et al.

(10) Patent No.: US 6,838,225 B2
(45) Date of Patent: Jan. 4, 2005

(54) RADIATION-SENSITIVE RESIN COMPOSITION

(75) Inventors: Yukio Nishimura, Mie (JP); Masafumi Yamamoto, Mie (JP); Atsuko Kataoka, Mie (JP); Toru Kajita, Mie (JP)

(73) Assignee: JSR Corporation, Tokyo (JP)

(*) Notice: Subject to any disclaimer, the term of this patent is extended or adjusted under 35 U.S.C. 154(b) by 176 days.

(21) Appl. No.: 10/046,080

(22) Filed: Jan. 16, 2002

(65) Prior Publication Data

US 2002/0132181 A1 Sep. 19, 2002

(30) Foreign Application Priority Data

Jan. 18, 2001 (JP) .......................................... 2001-10005

(51) Int. Cl.⁷ .............................................. G03F 7/004
(52) U.S. Cl. ..................... 430/270.1; 430/922; 430/910
(58) Field of Search ............................. 430/270.1, 910, 430/922

(56) References Cited

U.S. PATENT DOCUMENTS

| | | | |
|---|---|---|---|
| 5,215,857 A | 6/1993 | Hosaka et al. | |
| 5,238,774 A | 8/1993 | Hosaka et al. | |
| 5,405,720 A | 4/1995 | Hosaka et al. | |
| 5,494,784 A | 2/1996 | Hosaka et al. | |
| 5,925,492 A | 7/1999 | Hosaka et al. | |
| 6,020,104 A | 2/2000 | Hosaka et al. | |
| 6,045,970 A | * 4/2000 | Choi ........................ | 430/270.1 |
| 6,093,517 A | * 7/2000 | Ito et al. .................. | 430/270.1 |
| 6,143,460 A | 11/2000 | Kobayashi et al. | |
| 6,187,504 B1 | * 2/2001 | Suwa et al. .............. | 430/270.1 |
| RE37,179 E | 5/2001 | Yamachika et al. | |
| 6,228,554 B1 | 5/2001 | Hosaka et al. | |
| 6,270,939 B1 | 8/2001 | Hosaka et al. | |
| 6,280,900 B1 | 8/2001 | Chiba et al. | |
| 6,337,171 B1 | 1/2002 | Kobayashi et al. | |
| 2001/0026901 A1 | * 10/2001 | Maeda et al. ............ | 430/270.1 |
| 2002/0009668 A1 | * 1/2002 | Nishimura et al. ...... | 430/270.1 |

FOREIGN PATENT DOCUMENTS

| | | |
|---|---|---|
| EP | 0 930 541 | 7/1999 |
| EP | 1 193 558 | 4/2002 |
| JP | 22660 | 1/1990 |
| JP | 226461 | 8/1992 |
| JP | 234511 | 9/1995 |

OTHER PUBLICATIONS

Patent Abstracts of Japan, Publication No. 2000159758, vol. 2000, No. 09, Jun. 13, 2000, U.S. 6280898.
Patent Abstracts of Japan, Publication No. 2000026446, vol. 2000, No. 04, Jan. 25, 2000, U.S. 20010026901.
Patent Abstracts of Japan, Publication No. 07–234511, Date of Publication: Sep. 5, 1995.
Patent Abstracts of Japan, Publication No. 04–226461, Date of Publication: Aug. 17, 1992.
Patent Abstracts of Japan, Publication No. 02–27660, Date of Publication: Jun. 19, 1990–U.S. 4491628.

* cited by examiner

*Primary Examiner*—Yvette C. Thornton
(74) *Attorney, Agent, or Firm*—Piper Rudnick LLP; Steven B. Kelber

(57) ABSTRACT

A radiation-sensitive resin composition comprising: (A) an acid-dissociable group-containing resin, insoluble or scarcely soluble in alkali but becoming soluble in alkali when the acid-dissociable group dissociates, and containing recurring units with specific structures and (B) a photoacid generator of the formula (3),

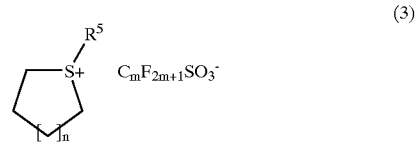

(3)

wherein $R^5$ represents a monovalent aromatic hydrocarbon group, m is 1–8, and n is 0–5. The resin composition is suitable as a chemically-amplified resist responsive to deep ultraviolet rays such as a KrF excimer laser and ArF excimer laser, exhibits high transparency, excellent resolution, dry etching resistance, and sensitivity, produces good pattern shapes, and well adheres to substrates.

14 Claims, No Drawings

RADIATION-SENSITIVE RESIN COMPOSITION

BACKGROUND OF THE INVENTION

1. Field of the Invention

The present invention relates to a radiation-sensitive resin composition and, more particularly, to a radiation-sensitive resin composition suitable as a chemically-amplified resist useful for microfabrication utilizing various types of radiation, for example, deep ultraviolet rays such as a KrF excimer laser or ArF excimer laser, X-rays such as synchrotron radiation, or charged particle rays such as electron beams.

2. Description of the Background Art

In the field of microfabrication represented by fabrication of integrated circuit devices, lithographic technology enabling microfabrication with a line width of 0.20 μm or less has been demanded in order to achieve a higher degree of integration.

A conventional lithographic process utilizes near ultraviolet rays such as an i-line radiation. It is known in the art that microfabrication with a line width of sub-quarter micron using near ultraviolet rays is very difficult.

Therefore, use of radiation with a shorter wavelength has been studied for enabling microfabrication with a line width of 0.20 μm or less. Deep ultraviolet rays represented by a line spectrum of a mercury lamp and an excimer laser, X-rays, electron beams, and the like can be given as radiation with a shorter wavelength. Of these, a KrF excimer laser (wavelength: 248 nm) and an ArF excimer laser (wavelength: 193 nm) have attracted attention.

As a resist applicable to the excimer laser radiation, a number of resists utilizing a chemical amplification effect between a component having an acid-dissociable functional group and a component generating an acid (hereinafter referred to as "photoacid generator") which generates an acid upon irradiation (hereinafter referred to as "exposure") has been proposed. Such a resist is hereinafter called a chemically-amplified resist.

As such a chemically-amplified resist, Japanese Patent Publication No. 27660/1990 discloses a resist comprising a polymer containing a t-butyl ester group of carboxylic acid or a t-butylcarbonate group of phenol and a photoacid generator. The t-butyl ester group or t-butyl carbonate group in the polymer dissociates by the action of an acid generated upon exposure, whereby the polymer has an acidic group such as a carboxylic group or a phenolic hydroxyl group. As a result, exposed areas of the resist film become readily soluble in an alkaline developer.

Most of conventional chemically-amplified resists use a phenol resin as a base resin. Deep ultraviolet rays used as radiation for exposure are absorbed due to an aromatic ring in the resin and cannot sufficiently reach the lower layers of the resist film. Because of this, the dose of the radiation is greater in the upper layers and is smaller in the lower layers of the resist film. This causes a resist pattern to be slimmer in the upper portion but broader toward the lower portion, thereby forming a trapezoid shape after development. No sufficient resolution can be obtained from such a resist film. Such a trapezoid resist pattern formed after development cannot give a desirable dimensional accuracy in the succeeding steps such as an etching step and an ion implantation step. In addition, if the configuration of the upper resist pattern is not rectangular, the resist disappears faster during dry etching, making it difficult to control etching conditions.

The shape of the resist pattern can be improved by increasing the radiation transmittance through the resist film. For example, (meth)acrylate resins represented by polymethylmethacrylate are desirable from the viewpoint of radiation transmittance due to superior transparency to deep ultraviolet rays. Japanese Patent Application Laid-open No. 226461/1992 proposes a chemically-amplified resist using a methacrylate resin, for example. However, in spite of the excellent micro-processing performance, this composition exhibits only poor dry etching resistance due to the absence of an aromatic ring, giving rise to difficulty in performing etching with high accuracy. This composition thus does not have both radiation transmittance and dry etching resistance at the same time.

As a means to improve dry etching resistance of the chemically-amplified resist without impairing the radiation transmittance, a method for introducing aliphatic rings into the resin component of the resist instead of aromatic rings has been known. For example, Japanese Patent Application Laid-open No. 234511/1995 discloses a chemically-amplified resist using a (meth)acrylate resin having aliphatic rings.

This resist includes groups which comparatively easily dissociate by conventional acids (acetal functional groups such as tetrahydropyranyl group, for example) and groups which are comparatively difficult to dissociate by acids (t-butyl functional groups such as t-butyl ester group or t-butylcarbonate group, for example) as acid-dissociable functional groups in the resin component. The resin component having the former acid-dissociable functional groups exhibits excellent basic characteristics as a resist, in particular, superior sensitivity and excellent pattern shape, but has poor storage stability as the composition. The resin component having the latter acid-dissociable functional groups has excellent storage stability, but exhibits impaired resist characteristics such as sensitivity and pattern shape. Moreover, inclusion of aliphatic rings in the resin component of this resist results in poor adhesion to substrates due to the extreme increase in hydrophobicity of the resin.

When forming a resist pattern using a chemically amplified resist, the resist is usually heated after exposure to accelerate dissociation of the acid-dissociable group. In this instance, if the heating temperature fluctuates, the resist pattern line width also fluctuates inevitably to a certain extent. However, to satisfy the requirement for microfabrication of integrated circuit elements in recent years, development of a resist exhibiting a small line width fluctuation according the heating temperature after exposure, i.e. exhibiting small temperature dependency, has been desired.

In addition, the photoacid generator is known to greatly affect the functions of a chemically-amplified resist. Presently, onium salt compounds which generate an acid upon exposure at a high quantum yield and exhibit high sensitivity are widely used as a photoacid generator for chemically-amplified resists.

As such onium salt compounds, triphenylsulfonium trifluoromethane sulfonate, triphenylsulfonium hexafluoroantimonite, triphenylsulfonium naphthalenesulfonate, cyclohexylmethyl(2-oxocyclohexyl) sulfonium trifluoromethanesulfonate, and the like are used. Most of these conventional onium salt compounds, however, do not exhibit satisfactory sensitivity. Although some compounds may exhibit comparatively high sensitivity, they are not necessarily satisfactory in overall resist performance such as resolution, pattern configuration, and the like.

In view of development of technology capable of dealing with recent progress in microfabrication of integrated circuit devices, a chemically-amplified resist which is applicable to short wavelength radiation represented by deep ultraviolet rays, exhibits high radiation transmittance, and excels in basic characteristics as a resist such as sensitivity, resolution, dry etching resistance, and pattern shape has been strongly demanded.

An object of the present invention is to provide a radiation-sensitive resin composition useful as a chemically amplified resist having high transmittance of radiation and exhibiting superior basic properties as a resist such as high sensitivity, resolution, dry etching tolerance, and pattern shape.

SUMMARY OF THE INVENTION

The above object can be achieved in the present invention by a radiation-sensitive resin composition comprising:

(A) an acid-dissociable group-containing resin which is insoluble or scarcely soluble in alkali and becomes alkali soluble when the acid-dissociable group dissociates, the resin comprising the recurring unit of the following formula (1) and the recurring unit of the following formula (2),

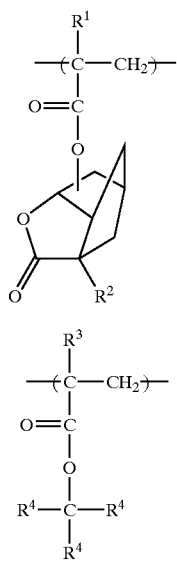

wherein $R^1$ and $R^2$ individually represent a hydrogen atom or methyl group, $R^3$ represents a hydrogen atom or methyl group, and $R^4$ individually represents a linear or branched alkyl group having 1–4 carbon atoms or a monovalent alicyclic hydrocarbon group having 4–20 carbon atoms or a derivative thereof, or any two of $R^4$ groups form in combination a divalent alicyclic hydrocarbon group having 4–20 carbon atoms or a derivative thereof, with the remaining $R^4$ group being a linear or branched alkyl group having 1–4 carbon atoms or a monovalent alicyclic hydrocarbon group having 4–20 carbon atoms or a derivative thereof, and (B) a photoacid generator of the following formula (3),

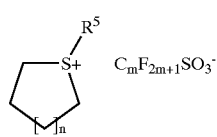

wherein $R^5$ represents a monovalent aromatic hydrocarbon group having 6–20 carbon atoms or a derivative thereof, m is an integer of 1–8, and n is an integer of 0–5.

Other objects, features and advantages of the invention will hereinafter become more readily apparent from the following description.

DETAILED DESCRIPTION OF THE INVENTION AND PREFERRED EMBODIMENTS

The present invention will be described in detail below.

(A) Resin

The component (A) of the present invention is an acid-dissociable group-containing resin having a recurring unit of the above formula (1) (hereinafter referred to as "recurring unit (1)") and a recurring unit of the above formula (2) (hereinafter referred to as "recurring unit (2)"). The resin is insoluble or scarcely soluble in alkali, but becomes alkali soluble when the acid-dissociable group dissociates (this resin is hereinafter referred to as "resin (A)").

If 50% or more of the initial film thickness of a resist film remains after development when a resist film made only from the resin (A) is developed under the same alkaline development conditions employed for forming a resist pattern using a resist film formed from a radiation-sensitive resin composition comprising the resin (A), such a characteristic of the resin (A) is referred to as "insoluble or scarcely soluble in alkali" in the present invention.

The carbonyloxy group combined with the main chain of the recurring unit (1) may bond with a carbon atom at any optional position other than the carbon atoms forming a lactone group in the ring or the carbon atom with which the group $R^2$ bonds, with the position shown in the following formula (4) being preferable.

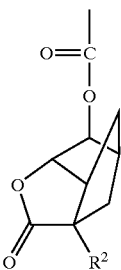

Preferable examples of the recurring unit (1) include: an acrylic recurring unit having a hydrogen atom for $R^2$, a carbonyloxy group combined with the main chain at the position shown in the above formula (4), and a hydrogen atom for $R^1$; a methacrylic recurring unit having a hydrogen atom for $R^2$, a carbonyloxy group combined with the main chain at the position shown in the above formula (4), and a methyl group for $R^1$; an acrylic recurring unit having a methyl group for $R^2$, a carbonyloxy group combined with the main chain at the position shown in the above formula (4), and a hydrogen atom for $R^1$; and a methacrylic recurring unit having a methyl group for $R^2$, a carbonyloxy group combined with the main chain at the position shown in the above formula (4), and a methyl group for $R^1$.

The recurring unit (1) may be used in the resin (A) either individually or in combination of two or more.

The recurring unit (1) is a unit derived from a corresponding (meth)acrylic acid ester.

As examples of the linear or branched alkyl group having 1–4 carbon atoms for $R^4$ in the recurring unit (2), a methyl group, ethyl group, n-propyl group, i-propyl group, n-butyl group, 2-methylpropyl group, 1-methylpropyl group, and t-butyl group can be given.

Of these alkyl groups, a methyl group and ethyl group are particularly preferable.

As examples of the monovalent alicyclic hydrocarbon group having 4–20 carbon atoms and the divalent alicyclic hydrocarbon group having 4–20 carbon atoms formed by two $R^4$ groups, alicyclic groups derived from a cycloalkane such as a norbornane, tricyclodecane, tetracyclododecane, adamantane, cyclobutane, cyclopentane, cyclohexane, cycloheptane, or cyclooctane, and groups obtained by replacing hydrogen atoms on these alicyclic groups with one or more linear, branched, or cyclic alkyl groups having 1–4 carbon atoms, such as methyl group, ethyl group, n-propyl group, i-propyl group, n-butyl group, 2-methylpropyl group, 1-methylpropyl group, or t-butyl group, can be given.

Of these monovalent and divalent alicyclic hydrocarbon groups, alicyclic groups derived from norbornane, tricyclodecane, tetracyclododecane, or adamantane, groups in which a hydrogen atom on these aliphatic rings is replaced by the above alkyl group are preferable.

As examples of the derivatives of the above monovalent or divalent alicyclic hydrocarbon groups, groups having one or more substituents such as a hydroxyl group; a carboxyl group; a hydroxyalkyl group having 1–4 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; an alkoxyl group having 1–4 carbon atoms such as a methoxy group, ethoxy group, n-propoxy group, i-propoxy group, n-butoxy group, 2-methylpropoxy group, 1-methylpropoxy group, and t-butoxy group; a cyano group; a cyanoalkyl group having 2–5 carbon atoms such as a cyanomethyl group, 2-cyanoethyl group, 3-cyanopropyl group, and 4-cyanobutyl group; and the like can be given.

Of these substituents, a hydroxyl group, carboxyl group, hydroxymethyl group, cyano group, cyanomethyl group, and the like are preferable.

The group —COOC($R^4$)$_3$ in the recurring unit (2) is an acid-dissociable group which dissociates in the presence of an acid and produces a carboxyl group. Such a group is referred to as an acid-dissociable group (I) in the following description.

The groups of the following formulas (I-1) to (I-45) can be given as specific examples of preferable acid-dissociable groups (I).

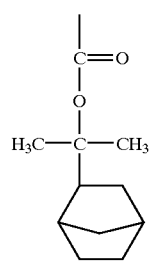

(I-1)

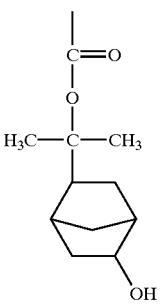

(I-2)

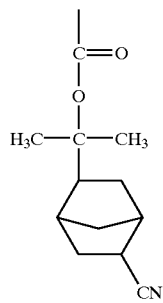

(I-3)

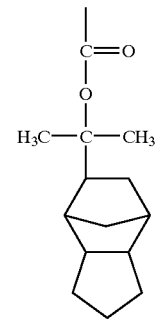

(I-4)

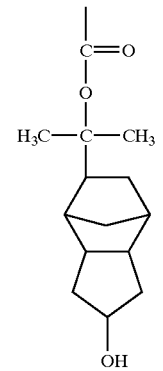

(I-5)

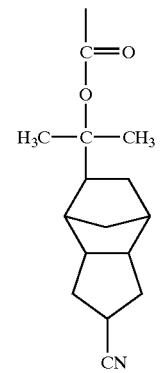

(I-6)

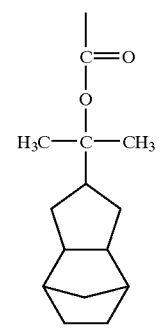

(I-7)

(I-8) 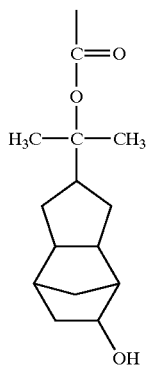
(I-9) 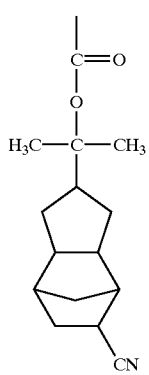
(I-10) 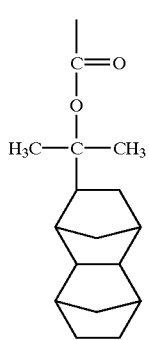
(I-11) 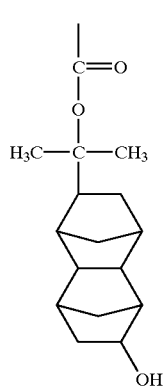
(I-12) 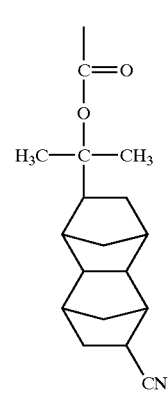
(I-13) 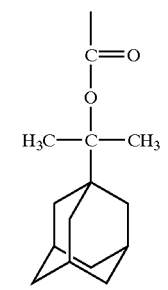
(I-14) 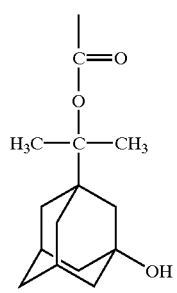
(I-15) 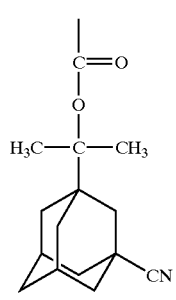
(I-16) 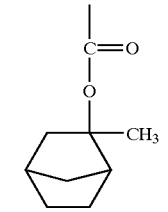

(I-17) 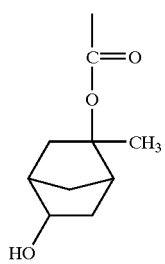
(I-18) 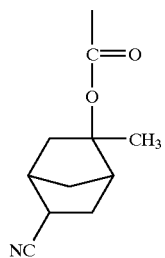
(I-19) 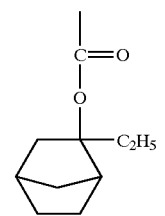
(I-20) 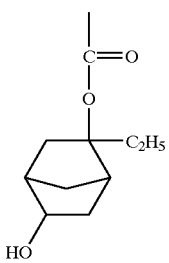
(I-21) 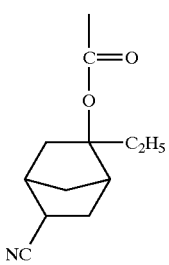
(I-22) 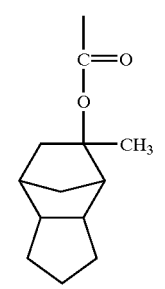
(I-23) 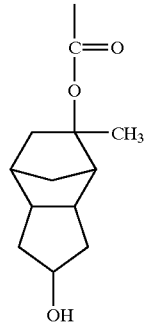
(I-24) 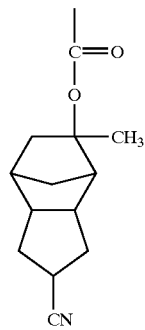
(I-25) 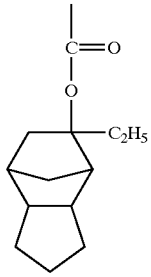
(I-26) 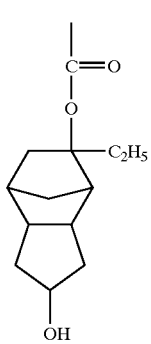
(I-27) 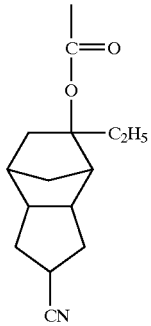

(I-28)
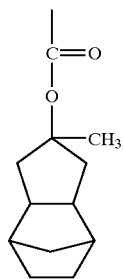
(I-29)
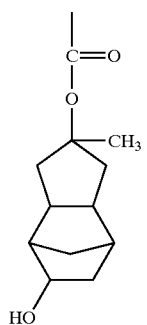
(I-30)
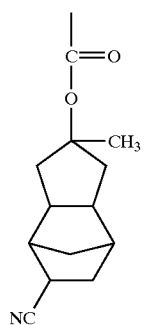
(I-31)
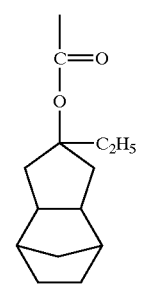
(I-32)
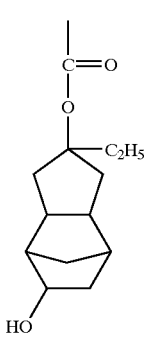
(I-33)
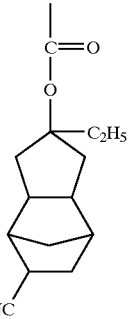
(I-34)
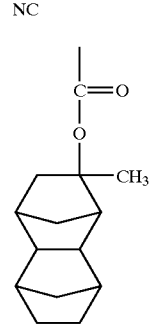
(I-35)
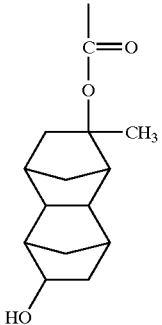
(I-36)
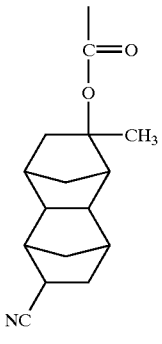
(I-37)
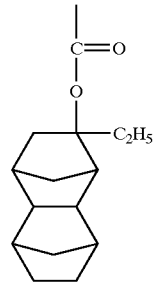

(I-38) 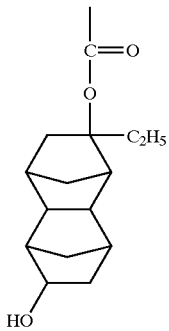

(I-39) 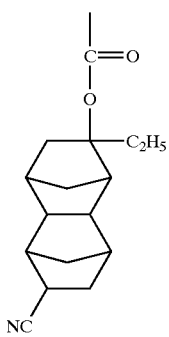

(I-40) 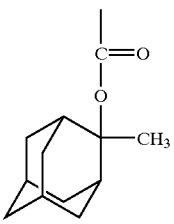

(I-41) 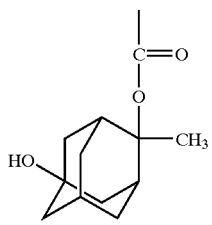

(I-42) 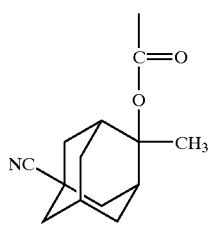

(I-43) 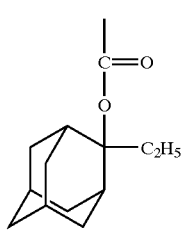

(I-44) 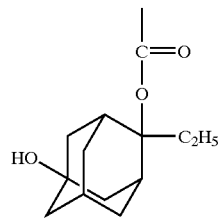

(I-45) 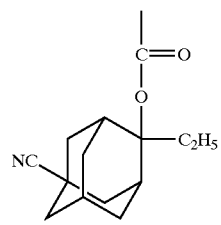

Of these acid-dissociable groups (I), t-butoxycarbonyl group and the groups of the formulas (I-1), (I-2), (I-10), (I-11), (I-13), (I-14), (I-16), (I-17), (I-34), (I-35), (I-40), (I-41), (I-43) or (I-44) are preferable.

The recurring unit (2) is a unit derived from a corresponding (meth)acrylic acid ester.

The resin (A) may comprise one or more recurring units other than the recurring unit (1) and the recurring unit (2) (hereinafter referred to as "other recurring units").

The following compounds can be given as examples of polymerizable unsaturated monomers which provide other recurring units.

Mono-functional monomers, which include (meth)acrylate having a bridged hydrocarbon skeleton such as norbornyl (meth)acrylate, isobornyl (meth)acrylate, tricyclodecanyl (meth)acrylate, tetracyclodecanyl (meth)acrylate, dicyclopentenyl (meth)acrylate, adamantly (meth)acrylate, 3-hydroxyadamantyl (meth)acrylate, and adamantylmethyl (meth)acrylate; carboxyl group-containing esters having a bridged hydrocarbon skeleton of an unsaturated carboxylic acid such as carboxynorbornyl (meth)acrylate, carboxytricyclodecanyl (meth)acrylate, and carboxytetracyclodecanyl (meth)acrylate; other mono-functional monomers having a bridged hydrocarbon skeleton such as norbornene (e.g. bicyclo[2.2.1]hept-2-ene), 5-methylbicyclo[2.2.1]hept-2-ene, 5-ethylbicyclo[2.2.1]hept-2-ene, 5-n-propylbicyclo[2.2.1]hept-2-ene, 5-n-butylbicyclo[2.2.1]hept-2-ene, 5-n-pentylbicyclo[2.2.1]hept-2-ene, 5-n-hexylbicyclo[2.2.1]hept-2-ene, 5-hydroxybicyclo[2.2.1]hept-2-ene, 5-hydroxymethylbicyclo[2.2.1]hept-2-ene, tetracyclo[4.4.0.1$^{2,5}$.1$^{7,10}$]dodec-3-ene, 8-methyltetracyclo[4.4.0.1$^{2,5}$.1$^{7,10}$]dodec-3-ene, 8-ethyltetracyclo[4.4.0.1$^{2,5}$.1$^{7,10}$]dodec-3-ene, 8-n-propyltetracyclo[4.4.0.1$^{2,5}$.1$^{7,10}$]dodec-3-ene, 8-n-butyltetracyclo[4.4.0.1$^{2,5}$.1$^{7,10}$]dodec-3-ene, 8-n-pentyltetracyclo[4.4.0.1$^{2,5}$.1$^{7,10}$]dodec-3-ene, 8-n-hexyltetracyclo[4.4.0.1$^{2,5}$.1$^{7,10}$]dodec-3-ene, 8-hydroxytetracyclo[4.4.0.1$^{2,5}$.1$^{7,10}$]dodec-3-ene, 8-hydroxymethyltetracyclo[4.4.0.1$^{2,5}$.1$^{7,10}$]dodec-3-ene, 8-fluorotetracyclo[4.4.0.1$^{2,5}$.1$^{7,10}$]dodec-3-ene, 8-fluoromethyltetracyclo[4.4.0.1$^{2,5}$.1$^{7,10}$]dodec-3-ene, 8-difluoromethyltetracyclo[4.4.0.1$^{2,5}$.1$^{7,10}$]dodec-3-ene, 8-trifluoromethyltetracyclo[4.4.0.1$^{2,5}$.1$^{7,10}$]dodec-3-ene, 8-pentafluoroethyltetracyclo[4.4.0.1$^{2,5}$.1$^{7,10}$]dodec-3-ene, 8,8-difluorotetracyclo[4.4.0.1$^{2,5}$.1$^{7,10}$]dodec-3-ene, 8,9-difluorotetracyclo[4.4.0.1$^{2,5}$.1$^{7,10}$]dodec-3-ene, 8,8-bis(trifluoromethyl)tetracyclo[4.4.0.1$^{2,5}$.1$^{7,10}$]dodec-3-ene, 8,9-bis(trifluoromethyl)tetracyclo[4.4.0.1$^{2,5}$.1$^{7,10}$]dodec-3-ene, 8-methyl-8-trifluoromethyltetracyclo[4.4.0.1$^{2,5}$.1$^{7,10}$]dodec-3-ene, 8,8,9-trifluorotetracyclo[4.4.0.1$^{2,5}$.1$^{7,10}$]dodec-3-ene, 8,8,9-tris(trifluoromethyl)tetracyclo[4.4.0.1$^{2,5}$.1$^{7,10}$]dodec-3-ene, 8,8,9,9-tetrafluorotetracyclo[4.4.0.1$^{2,5}$.1$^{7,10}$]dodec-3-ene, 8,8,9,9-tetrakis(trifluoromethyl)tetracyclo-[4.4.0.1$^{2,5}$.1$^{7,10}$]dodec-3-ene, 8,8-difluoro-9,9-bis(trifluoromethyl)tetracyclo-[4.4.0.1$^{2,5}$.1$^{7,10}$]dodec-3-ene, 8,9-difluoro-8,9-bis(trifluoromethyl)tetracyclo-[4.4.0.1$^{2,5}$.1$^{7,10}$]dodec-3-ene, 8,8,9-trifluoro-9-trifluoromethyltetracyclo-[4.4.0.1$^{2,5}$.1$^{7,10}$]dodec-3-ene, 8,8,9-trifluoro-9-trifluoromethoxytetracyclo-[4.4.0.1$^{2,5}$.1$^{7,10}$]dodec-3-ene, 8,8,9-trifluoro-9-pentafluoropropoxytetracyclo-[4.4.0.1$^{2,5}$.1$^{7,10}$]dodec-3-ene, 8-fluoro-8-pentafluoroethyl-9,9-bis(trifluoromethyl)-tetracylo[4.4.0.1$^{2,5}$.1$^{7,10}$]dodec-3-ene, 8,9-difluoro-8-heptafluoroisopropyl-9-trifluoromethyl-tetracyclo[4.4.0.1$^{2,5}$.1$^{7,10}$]dodec-3-ene, 8-chloro-8,9,9-trifluorotetracyclo[4.4.0.1$^{2,5}$.1$^{7,10}$]dodec-3-ene, 8,9-dichloro-8,9-bis(trifluoromethyl)tetracyclo-[4.4.0.1$^{2,5}$.1$^{7,10}$]dodec-3-ene 8-(2',2 ',2'-trifluorocarboethoxy)tetracyclo-[4.4.0.1$^{2,5}$.1$^{7,10}$]dodec-3-ene, 8-methyl-8-(2',2',2'-trifluorocarboethoxy)tetracyclo-[4.4.0.1$^{2,5}$.1$^{7,10}$]dodec-3-ene, dicyclopentadiene, tricyclo[5.2.1.0$^{2,6}$]dec-8-ene, tricyclo[5.2.1.0$^{2,6}$]dec-3-ene, tricyclo[4.4.0.1$^{2,5}$]undec-3-ene, tricyclo[6.2.1.0$^{1,8}$]undec-9-ene, tricyclo[6.2.1.0$^{1,8}$]undec-4-ene, tetracyclo[4.4.0.1$^{2,5}$.1$^{7,10}$.0$^{1,6}$]dodec-3-ene, 8-methyltetracyclo[4.4.0.1$^{2,5}$.1$^{7,10}$.0$^{1,6}$]dodec-3-ene, 8-ethylidenetetracyclo[4.4.0.1$^{2,5}$.1$^{7,12}$]dodec-3-ene, 8-ethylidenetetracyclo[4.4.0.1$^{2,5}$.1$^{7,12}$.0$^{1,6}$]dodec-3-ene, pentacyclo[6.5.1.1$^{3,6}$.0$^{2,7}$.0$^{9,13}$]pentadec-4-ene, and pentacyclo[7.4.0.1$^{2,5}$.1$^{9,12}$.0$^{8,13}$]pentadec-3-ene; (meth)acrylatic acid esters having no hydrocarbon skeleton such as methyl (meth)acrylate, ethyl (meth)acrylate, n-propyl (meth)acrylate, n-butyl (meth)acrylate, 2-methylpropyl (meth)acrylate, 2-hydroxyethyl (meth)acrylate, 2-hydroxypiopyl (meth)acrylate, 3-hydroxypropyl (meth)acrylate, cyclopropyl (meth)acrylate, cyclopentyl (meth)acrylate, cyclohexyl (meth)acrylate, 4-methoxycyclohexyl (meth)acrylate, 2-cyclopentyloxycarbonylethyl (meth)acrylate, 2-cyclohexyloxycarbonylethyl (meth)acrylate, and 2-(4-methoxycyclohexyl)oxycarbonylethyl (meth)acrylate; α-hydroxymethylacrylic acid esters such as methyl α-hydroxymethyl acrylate, ethyl α-hydroxymethyl acrylate, n-propyl α-hydroxymethyl acrylate, and n-butyl α-hydroxymethyl acrylate; unsaturated nitryl compounds such as (meth)acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl(meth)acrylamide, crotonamide, maleinamide, fumaramide, mesaconamide, citraconamide, and itaconamide; other nitrogen-containing vinyl compounds such as N-(meth)acryloylmorpholine, N-vinyl-ε-caprolactam, N-vinylpyrrolidone, vinylpyridine, and vinylimidazole; unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters of unsaturated carboxylic acids having no bridged hydrocarbon skeleton such as 2-carboxyethyl (meth)acrylate, 2-carboxypropyl (meth)acrylate, 3-carboxypropyl (meth)acrylate, 4-carboxybutyl (meth)acrylate, and 4-carboxycyclohexyl (meth)acrylate; α-(meth)acryloyloxy-β-methoxycarbonyl-γ-butyrolactone, α-(meth)acryloyloxy-β-ethoxycarbonyl-γ-butyrolactone, α-(meth)acryloyloxy-β-n-propoxycarbonyl-γ-butyrolactone, α-(meth)acryloyloxy-β-i-propoxycarbonyl-γ-butyrolactone, α-(meth)acryloyloxy-β-n-butoxycarbonyl-γ-butyrolactone, α-(meth)acryloyloxy-β-(2-methylpropoxy)carbonyl-γ-butyrolactone, α-(meth)acryloyloxy-β-(1-methylpropoxy)carbonyl-γ-butyrolactone, α-(meth)acryloyloxy-β-t-butoxycarbonyl-γ-butyrolactone, α-(meth)acryloyloxy-β-cyclohexyloxycarbonyl-γ-butyrolactone, α-(meth)acryloyloxy-β-(4-t-butylcyclohexyloxy)carbonyl-γ-butyrolactone, α-(meth)acryloyloxy-β-phenoxycarbonyl-γ-butyrolactone, α-(meth)acryloyloxy-β-(1-ethoxyethoxy)carbonyl-γ-butyrolactone, α-(meth)acryloyloxy-β-(1-cyclohexyloxyethoxy)carbonyl-γ-butyrolactone, α-(meth)acryloyloxy-β-t-butoxycarbonylmethoxycarbonyl-γ-butyrolactone, α-(meth)acryloyloxy-β-tetrahydrofuranyloxycarbonyl-γ-butyrolactone, α-(meth)acryloyloxy-β-tetrahydropyranyloxycarbonyl-γ-butyrolactone, (meth)acryloyloxylactone compounds having an acid-dissociable group such as α-methoxycarbonyl-β-(meth)acryloyloxy-γ-butyrolactone, α-ethoxycarbonyl-β-(meth)acryloyloxy-γ-butyrolactone, α-n-propoxycarbonyl-β-(meth)acrylyloxy-γ-butyrolactone, α-i-propoxycarbonyl-β-(meth)acryloyloxy-γ-butyrolactone, α-n-butoxycarbonyl-β-(meth)acryloyloxy-γ-butyrolactone, α-(2-methylpropoxy)carbonyl-β-(meth)acryloyloxy-γ-butyrolactone, α-(1-methylpropoxy) carbonyl-β-(meth)-acryloyloxy-γ-butyrolactone, α-t-butoxycarbonyl-β-(meth)acryloyloxy-γ-butyrolactone, α-cyclohexyloxycarbonyl-β-(meth)acryloyloxy-γ-butyrolactone, α-(4-t-butylcyclohexyloxy)carbonyl-β-(meth)acryloyloxy-γ-butyrolactone, α-phenoxycarbonyl-β-(meth)acryloyloxy-γ-butyrolactone, α-(1-ethoxyethoxy)carbonyl-β-(meth)acryloyloxy-γ-butyrolactone, α-(1-cyclohexyloxyethoxy)carbonyl-β-(meth)acryloyloxy-γ-butyrolactone, α-t-butoxycarbonylmethoxycarbonyl-β-(meth)acryloyloxy-γ-butyrolactone, α-tetrahydrofuranyloxycarbonyl-β-(meth)acryloyloxy-γ-butyrolactone, and α-tetrahydropyranyloxycarbonyl-β-(meth)acryloyloxy-γ-butyrolactone; (meth)acryloyloxylactone compound having no acid-dissociable group such as α-(meth)acryloyloxy-γ-butylolactone, α-(meth)acryloyloxy-β-fluoro-γ-butylolactone, α-(meth)acryloyloxy-β-hydroxy-γ-butylolactone, α-(meth)acryloyloxy-β-methyl-γ-butylolactone, α-(meth)acryloyloxy-β-ethyl-γ-butylolactone, α-(meth)acryloyloxy-β,β-dimethyl-γ-butylolactone, α-(meth)acryloyloxy-β-methoxy-γ-butylolactone, β-(meth)acryloyloxy-γ-butylolactone, α-fluoro-β-(meth)acryloyloxy-γ-butylolactone, α-hydroxy-β-(meth)acryloyloxy-γ-butylolactone, α-methyl-β-(meth)acryloyloxy-γ-butylolactone, α-ethyl-β-(meth)acryloyloxy-γ-butylolactone, α,α-dimethyl -β-(meth)acryloyloxy-γ-butyloiactone, α-methoxy-β-(meth)acryloyloxy-γ-butylolactone, and α-(meth)acryloyloxy-δ-mevalonolactone; and compounds in which a carboxyl group in the above unsaturated carboxylic acids or carboxyl group-containing esters having no bridged hydrocarbon skeleton of the above unsaturated carboxylic acids is converted into the later-described acid-dissociable group (i).

Poly-functional monomers including polyfunctional monomers having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyldimethylol di(meth)acrylate; and polyfunctional monomers having no bridged hydrocarbon skeletons such as methylene glycol di(meth)acrylate, ethylene glycol di(meth)acrylate, propylene glycol di(meth)acrylate, 1,6-hexanediol di (meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)

benzene di(meth)acrylate, and 1,3-bis(2-hydroxypropyl) benzene di(meth)acrylate.

The amount of the recurring unit (1) in the resin (A) is usually 10–80 mol %, preferably 20–70 mol %, and still more preferably 30–70 mol % of the total amount of the recurring units. If the amount of the recurring unit (1) is less than 10 mol %, developability and adhesion to substrates of a resist made from the resin tend to decrease. If the amount exceeds 80 mol %, resolution as a resist tends to decrease.

The amount of the recurring unit (2) is 10–80 mol %, preferably 20–70 mol %, and still more preferably 20–60 mol % of the total amount of the recurring units. If the amount of the recurring unit (2) is less than 10 mol %, resolution as a resist tends to decrease. If the amount exceeds 80 mol %, developability tends to decrease and scum tends to be produced when the resin is used as a resist.

The amount of the other recurring units is usually 50 mol % or less, and preferably 40 mol % or less.

The resin (A) is prepared by polymerizing polymerizable unsaturated monomers corresponding to each of the above recurring units in an appropriate solvent in the presence of a chain transfer agent, as required, using a radical polymerization initiator such as hydroperoxides, dialkyl peroxides, diacyl peroxides, or azo compounds.

As examples of the solvent used for polymerizing the components, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ethers such as tetrahydrofuran, dimethoxyethanes, propyleneglycol monomethylether, and diethoxyethanes; propyleneglycol monomethylether acetate, methylethylketone and the like can be given.

These solvents may be used either individually or in combination of two or more.

The polymerization temperature is usually 40–120° C., and preferably 50–90° C. The reaction time is usually 1–48 hours, and preferably 1–24 hours.

The polystyrene-reduced weight average molecular weight (hereinafter referred to as "Mw") of the resin (A) determined by gel permeation chromatography (GPC) is usually 3,000–30,000, preferably 5,000–30,000, and still more preferably 5,000–20,000. If Mw of the resin (A) is less than 3,000, heat resistance as a resist tends to decrease. If Mw exceeds 30,000, developability as a resist tends to decrease.

The ratio of Mw to the polystyrene-reduced number average molecular weight (hereinafter referred to as "Mn") determined by gel permeation chromatography (GPC) (Mw/Mn) of the resin (A) is usually 1–5, and preferably 1–3.

It is preferable that the resin (A) contains almost no impurities such as halogens and metals. The smaller the amount of impurities, the better the sensitivity, resolution, process stability, and pattern shape of the resist. The resin (A) may be purified using a chemical purification process such as washing with water or liquid-liquid extraction or a combination of the chemical purification process and a physical purification process such as ultrafiltration or centrifugation, for example.

Acid generator (B)

The component (B) of the present invention is a photoacid generator which is a compound of the above-described formula (3) generating an acid upon exposure to light (hereinafter referred to as "acid generator (B)").

The acid generator (B) causes the acid-dissociable group in the resin (A) to dissociate by the action of an acid generated upon exposure. As a result, exposed areas of the resist film become readily soluble in an alkaline developer, whereby a positive-tone resist pattern is formed.

The following groups are given as examples of the monovalent aromatic hydrocarbon group having 6–20 carbon atoms represented by $R^5$ in the formula (3): a phenyl group and its derivatives obtained by substituting hydrogen atoms on the ring with a linear or branched alkyl group having 1–6 carbon atoms such as o-tolyl group, m-tolyl group, p-tolyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4,6-trimethylphenyl group, and 4-ethylphenyl group; and a naphthyl group or a methyl or ethyl-substituted naphthyl group such as a 1-naphthyl group, 2-methyl-1-naphthyl group, 3-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 2,3-dimethyl-1-naphthyl group, 2,4-dimethyl-1-naphthyl group, 2,5-dimethyl-1-naphthyl group, 2,6-dimethyl-1-naphthyl group, 2,7-dimethyl-1-naphthyl group, 2,8-dimethyl-1-naphthyl group, 3,4-dimethyl-1-naphthyl group, 3,5-dimethyl-1-naphthyl group, 3,6-dimethyl-1-naphthyl group, 3,7-dimethyl-1-naphthyl group, 3,8-dimethyl-1-naphthyl group, 4,5-dimethyl-1-naphthyl group, 5,8-dimethyl-1-naphthyl group, 4-ethyl-1-naphthyl group, 1-methyl-2-naphthyl group, 3-methyl-2-naphthyl group , and 4-methyl-2-naphthyl group.

As substituent in the derivatives of the above-mentioned aromatic hydrocarbon group, a hydroxyl group; carboxyl group; a linear or branched hydroxyalkyl group having 1–4 carbon atoms such as a hydroxymethyl group, 1-hydroxyethyl group, 2-hydroxyethyl group, 3-hydroxypropyl group, and 4-hydroxybutyl group; a linear or branched alkoxyl group having 1–4 carbon atoms such as a methoxy group, ethoxy group, n-propoxy group, i-propoxy group, n-butoxy group, 2-methylpropoxy group, 1-methylpropoxy group, and t-butoxy group; a linear or branched alkoxymethoxy group having 2–5 carbon atoms such as a methoxymethoxy group, ethoxymethoxy group, n-propoxymethoxy group, i-propoxymethoxy group, n-butoxymethoxy group, and t-butoxymethoxy group; a linear or branched 1-alkoxyethoxy group having 3–6 carbon atoms such as a 1-methoxyethoxy group, 1-ethoxyethoxy group, 1-n-propoxyethoxy group, 1-i-propoxyethoxy group, 1-n-butoxyethoxy group, and 1-t-butoxyethoxy group; a linear or branched 2-alkoxyethoxy group having 3–6 carbon atoms such as a 2-methoxyethoxy group, 2-ethoxyethoxy group, 2-n-propoxyethoxy group, 2-i-propoxyethoxy group, 2-n-butoxyethoxy group, and 2-t-butoxyethoxy group; a linear or branched alkoxycarbonyloxy group having 2–5 carbon atoms such as a methoxycarbonyloxy group, ethoxycarbonyl oxy group, n-propoxycarbonyloxy group, i-propoxycarbonyloxy group, n-butoxycarbonyloxy group, and t-butoxycarbonyloxy group; an aralkyloxy group having 7–12 carbon atoms such as benzyloxy group and phenethyloxy group; an arylacetomethyl group having 9–15 carbon atoms such phenylacetomethyl group and 1-naphthylacetomethyl group; an oxygen-containing group such as 2-tetrahydrofuranyloxy group and 2-tetrahydropyranyloxy group; and a nitrogen-containing group such as cyanomethyl group, 2-cyanoethyl group, 3-cyanopropyl group, and 4-cyanobutyl group can be given.

As a monovalent aromatic hydrocarbon group having 6–20 carbon atoms represented by $R^5$ or the derivatives thereof, 3,5-dimethyl-4-hydroxyphenyl group, 4-methoxyphenyl group, 4-n-butoxyphenyl group, 2,4-dimethoxyphenyl group, 3,5-dimethoxyphenyl group, 4-n-butoxy-1-naphthyl group, and the like are preferable.

In the formula (3), 8 or 4 is particularly preferable as the integer m, and 1 is particularly preferable as the integer n.

The group $C_mF_{2m+1}$ in the formula (3) is a perfluoroalkyl group having carbon atoms of the number m. The alkyl group may be either linear or branched.

The following compounds can be given as examples of the acid generator (B) preferably used in the present invention:

1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
1-(4-n-butoxyphenyl)tetrahydrothiophenium trifluoromethanesulfonate,
1-(4-n-butoxyphenyl)tetrahydrothiophenium nonafluoro-n-butanesulfonate,
1-(4-n-butoxyphenyl)tetrahydrothiophenium perfluoro-n-octanesulfonate,
4-hydroxy-1-naphthyltetrahydrothiophenium trifluoromethanesulfonate,
4-hydroxy-1-naphthyltetrahydrothiophenium nonafluoro-n-butanesulfonate,
4-hydroxy-1-naphthyltetrahydrothiophenium perfluoro-n-octanesulfonate,
4-methoxy-1-naphthyltetrahydrothiophenium trifluoromethanesulfonate,
4-methoxy-1-naphthyltetrahydrothiophenium nonafluoro-n-butanesulfonate,
4-methoxy-1-naphthyltetrahydrothiophenium perfluoro-n-octanesulfonate,
4-ethoxy-1-naphthyltetrahydrothiophenium trifluoromethanesulfonate,
4-ethoxy-1-naphthyltetrahydrothiophenium nonafluoro-n-butanesulfonate,
4-ethoxy-1-naphthyltetrahydrothiophenium perfluoro-n-octanesulfonate,
4-n-butoxy-1-naphthyltetrahydrothiophenium trifluoromethanesulfonate,
4-n-butoxy-1-naphthyltetrahydrothiophenium nonafluoro-n-butanesulfonate,
4-n-butoxy-1-naphthyltetrahydrothiophenium perfluoro-n-octanesulfonate,
4-methoxymethoxy-1-naphthyltetrahydrothiophenium trifluoromethanesulfonate,
4-methoxymethoxy-1-naphthyltetrahydrothiophenium nonafluoro-n-butanesulfonate,
4-methoxymethoxy-1-naphthyltetrahydrothiophenium perfluoro-n-octanesulfonate,
4-ethoxymethoxy-1-naphthyltetrahydrothiophenium trifluoromethanesulfonate,
4-ethoxymethoxy-1-naphthyltetrahydrothiophenium nonafluoro-n-butanesulfonate,
4-ethoxymethoxy-1-naphthyltetrahydrothiophenium perfluoro-n-octanesulfonate,
4-(1-methoxyethoxy)-1-naphthyltetrahydrothiophenium trifluoromethanesulfonate,
4-(1-methoxyethoxy)-1-naphthyltetrahydrothiophenium nonafluoro-n-butanesulfonate,
4-(1-methoxyethoxy)-1-naphthyltetrahydrothiophenium perfluoro-n-octanesulfonate,
4-(2-methoxyethoxy)-1-naphthyltetrahydrothiophenium trifluoromethanesulfonate,
4-(2-methoxyethoxy)-1-naphthyltetrahydrothiophenium nonafluoro-n-butanesulfonate,
4-(2-methoxyethoxy)-1-naphthyltetrahydrothiophenium perfluoro-n-octanesulfonate,
4-methoxycarbonyloxy-1-naphthyltetrahydrothiophenium trifluoromethanesulfonate,
4-methoxycarbonyloxy-1-naphthyltetrahydrothiophenium nonafluoro-n-butanesulfonate,
4-methoxycarbonyloxy-1-naphthyltetrahydrothiophenium perfluoro-n-octanesulfonate,
4-ethoxycarbonyloxy-1-naphthyltetrahydrothiophenium trifluoromethanesulfonate,
4-ethoxycarbonyloxy-1-naphthyltetrahydrothiophenium nonafluoro-n-butanesulfonate,
4-ethoxycarbonyloxy-1-naphthyltetrahydrothiophenium perfluoro-n-octanesulfonate,
4-n-propoxycarbonyloxy-1-naphthyltetrahydrothiophenium trifluoromethanesulfonate,
4-n-propoxycarbonyloxy-1-naphthyltetrahydrothiophenium nonafluoro-n-butanesulfonate,
4-n-propoxycarbonyloxy-1-naphthyltetrahydrothiophenium perfluoro-n-octanesulfonate,
4-i-propoxycarbonyloxy-1-naphthyltetrahydrothiophenium trifluoromethanesulfonate,
4-i-propoxycarbonyloxy-1-naphthyltetrahydrothiophenium nonafluoro-n-butanesulfonate,
4-i-propoxycarbonyloxy-1-naphthyltetrahydrothiophenium perfluoro-n-octanesulfonate,
4-n-butoxycarbonyloxy-1-naphthyltetrahydrothiophenium trifluoromethanesulfonate,
4-n-butoxycarbonyloxy-1-naphthyltetrahydrothiophenium nonafluoro-n-butanesulfonate,
4-n-butoxycarbonyloxy-1-naphthyltetrahydrothiophenium perfluoro-n-octanesulfonate,
4-t-butoxycarbonyloxy-1-naphthyltetrahydrothiophenium trifluoromethanesulfonate,
4-t-butoxycarbonyloxy-1-naphthyltetrahydrothiophenium nonafluoro-n-butanesulfonate,
4-t-butoxycarbonyloxy-1-naphthyltetrahydrothiophenium perfluoro-n-octanesulfonate,
4-benzyloxy-1-naphthyltetrahydrothiophenium trifluoromethanesulfonate,
4-benzyloxy-1-naphthyltetrahydrothiophenium nonafluoro-n-butanesulfonate,
4-benzyloxy-1-naphthyltetrahydrothiophenium perfluoro-n-octanesulfonate,
1-(1-naphthylacetomethyl)tetrahydrothiophenium trifluoromethanesulfonate,
1-(1-naphthylacetomethyl)tetrahydrothiophenium nonafluoro-n-butanesulfonate,
1-(1-naphthylacetomethyl)tetrahydrothiophenium perfluoro-n-octanesulfonate,
4-(2-tetrahydrofuranyloxy)-1-naphthyltetrahydrothiophenium trifluoromethanesulfonate,
4-(2-tetrahydrofuranyloxy)-1-naphthyltetrahydrothiophenium nonafluoro-n-butanesulfonate,
4-(2-tetrahydrofuranyloxy)-1-naphthyltetrahydrothiophenium perfluoro-n-octanesulfonate,
4-(2-tetrahydropyranyloxy)-1-naphthyltetrahydrothiophenium trifluoromethanesulfonate, 4-(2-tetrahydropyranyloxy)-1-naphthyltetrahydrothiophenium nonafluoro-n-butanesulfonate, and
4-(2-tetrahydropyranyloxy)-1-naphthyltetrahydrothiophenium perfluoro-n-octanesulfonate.

Of these acid generators (B), 1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
4-hydroxy-1-naphthyltetrahydrothiophenium nonafluoro-n-butanesulfonate,
4-hydroxy-1-naphthyltetrahydrothiopheniumn perfluoro-n-octanesulfonate,
4-n-butoxy-1-naphthyltetrahydrothiophenium nonafluoro-n-butanesulfonate,
4-n-butoxy-1-naphthyltetrahydrothiophenium perfluoro-n-octanesulfonate,
1-(1-naphthylacetomethyl)tetrahydrothiophenium nonafluoro-n-butanesulfonate,
1-(1-naphthylacetomethyl)tetrahydrothiophenium perfluoro-n-octanesulfonate, and the like are particularly preferable.

In the present invention, the acid generator (B) may be used either individually or in combination of two or more.

In the present invention, the following photoacid generators (hereinafter referred to as "acid generator (b)") can be used in combination with the acid generator (B).

As examples of the acid generator (b), onium salts, halogen-containing compounds, diazoketone compounds, sulfone compounds, sulfonate compounds, and the like can be given.

Examples of the acid generator (b) are given below.

Onium Salt Compounds

As examples of the onium salt compounds, iodonium salt, sulfonium salt, phosphonium salt, diazonium salt, pyridinium salt, and the like can be given.

Specific examples of onium salt compounds include:

diphenyliodonium trifluoromethanesulfonate, diphenyliodonium nonafluoro-n-butanesulfonate, diphenyliodonium perfluoro-n-octanesulfonate,
bis(4-t-butylphenyl)iodonium trifluoromethanesulfonate,
bis(4-t-butylphenyl)iodonium nonafluoro-n-butanesulfonate,
bis(4-t-butylphenyl)iodonium perfluoro-n-octanesulfonate,
triphenylsulfonium trifluoromethanesulfonate,
triphenylsulfonium nonafluoro-n-butanesulfonate,
triphenylsulfonium perfluoro-n-octanesulfonate,
triphenylsulfonium 10-camphorsulfonate,
cyclohexyl.2-oxocyclohexyl.methylsulfonium trifluoromethanesulfonate,
dicyclohexyl.2-oxocyclohexylsulfonium trifluoromethanesulfonate,
2-oxocyclohexyldimethylsulfonium trifluoromethanesulfonate,
1-naphthyldimethylsulfonium trifluoromethanesulfonate,
1-naphthyldiethylsulfonium trifluoromethanesulfonate,
4-cyano-1-naphthyldimethylsulfonium trifluoromethanesulfonate,
4-nitro-1-naphthyldimethylsulfonium trifluoromethanesulfonate,
4-methyl-1-naphthyldimethylsulfonium trifluoromethanesulfonate,
4-cyano-1-naphthyldiethylsulfonium trifluoromethanesulfonate,
4-nitro-1-naphthyldiethylsulfonium trifluoromethanesulfonate,
4-methyl-1-naphthyldiethylsulfonium trifluoromethanesulfonate, and
4-hydroxy-1-naphthyldimethylsulfonium trifluoromethanesulfonate.

Halogen-Containing Compounds

As examples of halogen-containing compounds, haloalkyl group-containing hydrocarbon compounds, haloalkyl group-containing heterocyclic compounds, and the like can be given.

As examples of preferable halogen-containing compounds, (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine, 1,1-bis(4-chlorophenyl)-2,2,2-trichloroethane, and the like can be given.

Diazoketone Compounds

As examples of diazoketone compounds, 1,3-diketo-2-diazo compounds, diazobenzoquinone compounds, diazonaphthoquinone compounds, and the like can be given.

As examples of preferable diazoketone compounds, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, 1,2-naphthoquinonediazido-4-sulfonate or 1,2-naphthoquinonediazido-5-sulfonate of 1,1,1-tris (4-hydroxyphenyl)ethane, and the like can be given.

Sulfone Compounds

As examples of the sulfone compounds, β-ketosulfone, β-sulfonylsulfone, α-diazo compounds of these compounds, and the like can be given.

As examples of preferable sulfone compounds, 4-trisphenacylsulfone, mesitylphenacylsulfone, bis(phenylsulfonyl)methane, and the like can be given.

Sulfonate Compounds

As examples of the sulfonate compounds, alkyl sulfonate, alkylimide sulfonate, haloalkyl sulfonate, aryl sulfonate, imino sulfonate, and the like can be given.

As examples of preferable sulfone compounds, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimidetrifluoromethanesulfonate, N-hydroxysuccinimidenonafluoro-n-butanesulfonate, N-hydroxysuccinimideperfluoro-n-octanesulfonate, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octanesulfonate, and the like can be given.

Of these acid generators (b), the following compounds are preferable: diphenyliodonium trifluoromethanesulfonate, diphenyliodonium nonafluoro-n-butanesulfonate, diphenyliodonium perfluoro-n-octanesulfonate, bis(4-t-butylphenyl) iodonium trifluoromethanesulfonate, bis(4-t-butylphenyl) iodonium nonafluoro-n-butanesulfonate, bis(4-t-butylphenyl)iodonium perfluoro-n-octanesulfonate, triphenylsulfonium trifluoromethanesulfonate, triphenylsulfonium nonafluoro-n-butanesulfonate, triphenylsulfonium perfluoro-n-octanesulfonate, cyclohexyl.2-oxocyclohexyl.methylsulfonium trifluoromethanesulfonate, dicyclohexyl.2-oxo cyclohexylsulfonium trifluoromethanesulfonate, 2-oxocyclohexyldimethylsulfonium trifluoromethanesulfonate, 4-hydroxy-1-naphthyl dimethyl-sulfoniumtrifluoromethane sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimido trifluoromethanesulfonate, N-hydroxysuccinimido nonafluoro-n-butanesulfonate, N-hydroxysuccinimido perfluoro-n-octanesulfonate, and 1,8-naphthalenedicarboxylic acid imide trifluoromethane-sulfonate.

The acid generators (b) may be used either individually or in combination of two or more.

The total amount of the acid generator (B) and the acid generator (b) used in the radiation-sensitive resin composition of the present invention is usually 0.1–20 parts by weight, and preferably 0.5–10 parts by weight for 100 parts by weight of the resin (A) from the viewpoint of ensuring sensitivity and developability as a resist. If this total amount is less than 0.1 part by weight, sensitivity and developability tend to decrease. If the amount exceeds 20 parts by weight, a rectangular resist pattern may not be obtained due to decreased radiation transmittance.

The proportion of the acid generator (b) to be added is 80 wt % or less, and preferably 60 wt % or less of the total amount of the acid generator (B) and the acid generator (b). If the proportion of the acid generator (b) exceeds 80 wt %, the desired effects of the present invention may be impaired.

It is preferable to add an acid diffusion controller to the radiation-sensitive resin composition of the present invention. The acid diffusion controller controls diffusion of an acid generated from the acid generator (B) or acid generator (b) upon exposure in the resist film to hinder unfavorable chemical reactions in the unexposed area.

The addition of such an acid diffusion controller improves storage stability of the resulting radiation-sensitive resin composition and resolution as a resist. Moreover, the addition of the acid diffusion controller prevents the line width of the resist pattern from changing due to changes in the post-exposure delay (PED) between exposure and development, whereby a composition with remarkably superior process stability can be obtained.

As the acid diffusion controller, organic compounds containing nitrogen of which the basicity does not change during exposure or heating for forming a resist pattern are preferable.

As examples of such nitrogen-containing organic compounds, a compound shown by the following formula (5) (hereinafter called "nitrogen-containing compound (a)"),

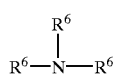

(5)

wherein $R^6$ individually represents a hydrogen atom, a substituted or unsubstituted, linear, branched, or cyclic alkyl group, substituted or unsubstituted aryl group, or substituted or unsubstituted aralkyl group, a compound having two nitrogen atoms in the molecule (hereinafter referred to as "nitrogen-containing compound (b)"), a polyamino compound having three or more nitrogen atoms in the molecule (hereinafter referred to as "nitrogen-containing compound (c)"), amide group-containing compound, urea compound, nitrogen-containing heterocyclic compound, and the like can be given.

As examples of the nitrogen-containing compounds (a), mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine; and the like can be given.

Examples of the nitrogen-containing compound (b) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, and the like.

As examples of the nitrogen-containing compounds (c), polyethyleneimine, polyallylamine, a polymer of 2-dimethylaminoethylacrylamide, and the like can be given.

As examples of the amide group-containing compounds, N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone; and the like can be given.

As examples of the urea compounds, urea, methylurea, 1,1-dimethylurea, 1,3-dimethylurea, 1,1,3,3-tetramethylurea, 1,3-diphenylurea, tri-n-butylthiourea, and the like can be given. Examples of the nitrogen-containing heterocyclic compounds include: imidazoles such as imidazole, benzimidazole, 4-methylimidazole, 4-methyl-2- phenylimidazole, and N-t-butoxycarbonyl-2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane; and the like.

Of these nitrogen-containing organic compounds, the nitrogen-containing compounds (a), nitrogen-containing compounds (b), and nitrogen-containing heterocyclic compounds are preferable.

The acid diffusion controller may be used either individually or in combination of two or more.

The amount of the acid diffusion controller to be added is usually 15 parts by weight or less, preferably 10 parts by weight or less, and still more preferably 5 parts by weight or less for 100 parts by weight of the resin (A). If the proportion of the acid diffusion controller exceeds 15 parts by weight, sensitivity as a resist and developability of the exposed area tend to decrease. If the amount is less than 0.001 part by weight, the pattern shape or dimensional accuracy as a resist may decrease depending on the processing conditions.

An alicyclic additive having an acid-dissociable group may be added to the radiation-sensitive resin composition of the present invention to further improve dry etching resistance, pattern shape, adhesion to substrate, and the like.

The following compounds can be given as examples of the alicyclic additives: adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)-n-hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; and the like.

These alicyclic additives may be used either individually or in combination of two or more.

The amount of the alicyclic additives to be added is usually 50 parts by weight or less, and preferably 30 parts by weight or less for 100 parts by weight of the resin (A). If the amount of alicyclic additives exceeds 50 parts by weight, heat resistance as a resist tends to decrease.

Surfactants which improve applicability, developability, or the like may be added to the radiation-sensitive resin composition of the present invention.

As examples of surfactants, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, polyethylene glycol distearate; commercially available products such as KP341 (manufactured by Shin-Etsu Chemical Co., Ltd.), Polyflow No. 75, No. 95 (manufactured by Kyoeisha Chemical Co., Ltd.), FTOP EF301, EF303, EF352 (manufactured by TOHKEM PRODUCTS CORPORATION), MEGAFAC F171, F173 (manufactured by Dainippon Ink and Chemicals, Inc.), Florard FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.); and the like can be given.

These surfactants may be used either individually or in combination of two or more.

The amount of surfactants to be added is usually 2 parts by weight or less for 100 parts by weight of the total of the resin (A), acid generator (B), and acid generator (b).

As other additives, halation inhibitors, adhesion promoters, storage stabilizers, anti-foaming agents, and the like can be given.

Preparation of Composition Solution

The radiation-sensitive resin composition of the present invention is prepared as a composition solution by dissolving the composition in a solvent so that the total solid content is 5–50 wt %, and preferably 10–25 wt %, and filtering the composition using a filter with a pore diameter of about 0.2 $\mu$m, for example.

Examples of solvents used for the preparation of the composition solution include: linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, 2-hydroxy-2-methylethyl propionate, ethoxyethyl acetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butylacetate, methyl acetoacetoate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate; and the like.

These solvents may be used either individually or in combination of two or more. Among these solvents, linear or branched ketones, cyclic ketones, propylene glycol monoalkyl ether acetates, alkyl 2-hydroxypropionates, and alkyl 3-alkoxypropionates are preferable.

Formation of Resist Pattern

The radiation-sensitive resin composition of the present invention is particularly useful as a chemically-amplified resist.

In the chemically-amplified resist, an acid-dissociable group in the resin (A) dissociates by the action of an acid generated from the acid generator (B) or a mixture of the acid generator (B) and acid generator (b) upon exposure, thereby producing a carboxyl group. As a result, solublity of the exposed part of the resist in an alkaline developer increases, whereby the exposed part is dissolved in an alkaline developer and removed to obtain a positive-tone resist pattern.

A resist pattern is formed from the radiation-sensitive resin composition of the present invention by applying the composition solution to, for example, substrates such as a silicon wafer or a wafer coated with aluminum using an appropriate application method such as rotational coating, cast coating, and roll coating to form a resist film. The resist film is then optionally pre-baked (hereinafter called "PB") and exposed to form a predetermined resist pattern. As radiation used for exposure, visible rays, ultraviolet rays, deep ultraviolet rays, X-rays, electron beams, or the like are appropriately selected depending on types of the acid generator. It is particularly preferable to use an ArF excimer laser (wavelength: 193 nm) or KrF excimer laser (wavelength: 248 nm) An ArF excimer laser (wavelength: 193 nm) is particularly preferable.

In the present invention, it is preferable to perform post-exposure bake (hereinafter called "PEB"). PEB ensures smooth dissociation of the acid-dissociable group in the resin (A). The heating temperature for PEB is usually 30–200° C., and preferably 50–170° C., although the heating conditions vary depending on the composition of the radiation-sensitive resin composition.

In order to bring out latent capability of the radiation-sensitive resin composition of the present invention, an organic or inorganic anti-reflection film may be formed on a substrate as disclosed in Japanese Patent Publication No. 12452/1994, for example. Moreover, a protection film may be formed on the resist film as disclosed in Japanese Patent Publication No. 188598/1993, for example, in order to prevent the effects of basic impurities or the like in an environmental atmosphere. These techniques may be employed in combination.

The exposed resist film is then developed to form a predetermined resist pattern.

As examples of a developer used for development, it is preferable to use an alkaline aqueous solution prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diaza bicyclo-[4.3.0]-5-nonene.

The concentration of the alkaline aqueous solution is usually 10 wt % or less. If the concentration of the alkaline aqueous solution exceeds 10 wt %, an unexposed area may be dissolved in the developer.

Organic solvents or the like may be added to the developer containing an alkaline aqueous solution.

As examples of organic solvents, ketones such as acetone, methyl ethyl ketone, methyl i-butyl ketone, cyclopentanone, cyclohexanone, 3-methylcyclopentanone, and 2,6-dimethylcyclohexanone; alcohols such as methyl alcohol, ethyl alcohol, n-propyl alcohol, i-propyl alcohol, n-butyl alcohol, t-bulyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given.

These organic solvents may be used either individually or in combination of two or more.

The amount of the organic solvents is preferably 100 vol % or less of the alkaline aqueous solution. If the amount of the organic solvents exceeds 100 vol %, an exposed area may remain undeveloped due to decreased developability.

In addition, surfactants or the like may be added to the developer containing the alkaline aqueous solution in an appropriate amount.

The resist film is generally washed with water after development using a developer containing an alkaline aqueous solution.

EXAMPLES

The embodiments of the present invention will be described in more detail by examples. However, these examples should not be construed as limiting the present invention.

In the examples, part(s) refers to part(s) by weight unless otherwise indicated. Measurement and evaluation of each composition in the examples and comparative examples were carried out as follows.

Mw

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Radiation Transmittance A solution composition was applied to a quartz plate and the coating was post-baked on a hot plate at 90° C. for 60 seconds to obtain a resist film with a thickness of 0.4 μm. Radiation transmittance of the resist film was calculated from absorbance at a wavelength of 193 nm and was adopted as a standard for transparency in the deep UV ray region.

Sensitivity

A solution composition was applied to a silicon wafer (ARC) with a 520 Å thick Deep UV30J film (manufactured by Brewer Science Corp.) coated on the surface by spin coating and post-baked on a hot plate under the conditions shown in Table 2 to obtain a resist coating with a thickness of 0.4 μm. The coating was exposed to radiation through a mask pattern using an ArF excimer laser exposure apparatus (manufactured by Nikon Corp., lens numerical aperture: 0.55, wavelength: 193 nm). After PEB under the conditions shown in Table 2, the resist coatings were developed in a 2.38 wt % tetramethylammonium hydroxide aqueous solution (Examples 1–7) or 2.38×1/50 wt % tetramethylammonium hydroxide aqueous solution (Comparative Example 1) at 25° C. for 1 minute, washed with water, and dried to form a positive-tone resist pattern. An optimum dose capable of forming a 0.16 μm line-and-space pattern (1L1S) with a 1:1 line width was taken as sensitivity.

Resolution

Minimum dimensions of the resist pattern resolved at the optimum dose were taken as the resolution.

Dry-Etching Resistance

A composition solution was applied to a silicon wafer by spin coating and dried to form a resist film with a thickness of 0.5 μm. Then, the resist film was dry-etched using a Pinnacle 8000 (manufactured by PMT Co.) and with $CF_4$ as an etching gas at a flow rate of 75 sccm and an output of 2,500 W under a gas pressure of 2.5 mTorr to measure the etching rate. The relative etching rate was evaluated assuming that the etching rate of the resist film formed from the resin composition solution of Comparative Example 1 is 1.0. The smaller the etching rate, the better the dry-etching resistance.

Pattern Configuration

The dimensions of the lower side $L_1$ and the upper side $L_2$ of the rectangular cross-section of a line and space pattern (1L1S) with a line width of 0.16 μm were measured using a scanning electron microscope. A pattern shape which satisfied a formula "$0.85 \leq L_2/L_1 \leq 1$" and was straight with no extended skirt was evaluated as "Good", and otherwise evaluated as "Bad".

Synthesis Example 1

30 g of a compound of the following formula (6) and 20 g of 2-methyl-2-adamantyl methacrylate were dissolved in 50 g of tetrahydrofuran to obtain a homogeneous solution. After bubbling nitrogen for 30 minutes through the solution, 3 g of azobisisobutyronitrile was added as an initiator. The mixture was heated to 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin.

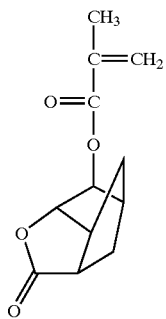

(6)

This resin was a copolymer with an Mw of 12,000, containing recurring units derived from the compound of the formula (6) and 2-methyl-2-adamantyl methacrylate in the amount of 60 mol % and 40 mol %, respectively. This resin is referred to as a "resin (A-1)".

Synthesis Example 2

28 g of the compound of the above formula (6), 21 g of 2-methyl-2-adamantyl methacrylate, and 1 g of N,N-dimethylacrylamide were dissolved in 50 g of tetrahydrofuran to obtain a homogeneous solution. After bubbling nitrogen for 30 minutes through the solution, 3 g of azobisisobutyronitrile was added as an initiator. The mixture was heated to 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin.

This resin was a copolymer with an Mw of 13,000, containing recurring units derived from the compound of the formula (6), 2-methyl-2-adamantyl methacrylate, and N,N-dimethylacrylamide in the amount of 55 mol %, 40 mol %, and 5 mol %, respectively. This resin is referred to as a "resin (A-2)".

Synthesis Example 3

15 g of the compound of the above formula (6), 20 g of 2-methyl-2-adamantyl methacrylate, and 15 g of 3-hydroxyadamantly acrylate were dissolved in 50 g of tetrahydrofuran to obtain a homogeneous solution. After bubbling nitrogen for 30 minutes through the solution, 3 g of azobisisobutyronitrile was added as an initiator. The mixture was heated to 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin. This resin was a copolymer with an Mw of 11,000, containing recurring units derived from the compound of the formula (6), 2-methyl-2-adamantyl methacrylate, and 3-hydroxyadamantly acrylate in the amount of 30 mol %, 40 mol %, and 30 mol %, respectively. This resin is referred to as a "resin (A-3)".

Synthesis Example 4

30 g of a compound of the above formula (6) and 20 g of 2-norbornyl-2-n-propyl acrylate were dissolved in 50 g of tetrahydrofuran to obtain a homogeneous solution. After bubbling nitrogen for 30 minutes through the solution, 3 g of azobisisobutyronitrile was added as an initiator. The mixture was heated to 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin.

This resin was a copolymer with an Mw of 12,600, containing recurring units derived from the compound of the formula (6) and 2-norbornyl-2-n-propyl acrylate in the amount of 60 mol % and 40 mol %, respectively. This resin is referred to as a "resin (A-4)".

Synthesis Example 5

22 g of the compound of the above formula (6), 18 g of 2-methyl-2-adamantyl methacrylate, 4 g of maleic anhydride, and 6 g of norbornene were dissolved in 50 g of tetrahydrofuran to obtain a homogeneous solution. After bubbling nitrogen for 30 minutes through the solution, 3 g of azobisisobutyronitrile was added as an initiator. The mixture was heated to 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin.

This resin was a copolymer with an Mw of 6,300, containing recurring units derived from the compound of the formula (6), 2-methyl-2-adamantyl methacrylate, maleic anhydride, and norbornene in the amount of 40 mol %, 30 mol %, 15 mol %, and 15 mol %, respectively. This resin is referred to as a "resin (A-5)".

Synthesis Example 6

25 g of a compound of the above formula (6) and 25 g of 2-methyl-2-adamantyl methacrylate were dissolved in 50 g of tetrahydrofuran to obtain a homogeneous solution. After bubbling nitrogen for 30 minutes through the solution, 3 g of azobisisobutyronitrile was added as an initiator. The mixture was heated to 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin.

This resin was a copolymer with an Mw of 11,000, containing recurring units derived from the compound of the formula (6) and 2-methyl-2-adamantyl methacrylate in the amount of 50 mol % and 50 mol % respectively. This resin is referred to as a resin (A-6)

Synthesis Example 7

15 g of the compound of the above formula (6), 22.5 g of 2-methyl-2-adamantyl methacrylate, and 12.5 g of 3-hydroxyadamantyl acrylate were dissolved in 50 g of tetrahydrofuran to obtain a homogeneous solution. After bubbling nitrogen for 30 minutes through the solution, 3 g of azobisisobutyronitrile was added as an initiator. The mixture was heated to 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin. This resin was a copolymer with an Mw of 11,000, containing recurring units derived from the compound of the formula (6), 2-methyl-2-adamantyl methacrylate, and 3-hydroxyadamantyl acrylate in the amount of 30 mol %, 45 mol % and 25 mol %, respectively. This resin is referred to as a resin (A-7)

Synthesis Example 8

28.75 g of the compound of the above formula (6), 28.75 g of 2-methyl-2-adamantyl methacrylate, and 2.5 g of methacrylic acid were dissolved in 50 g of tetrahydrofuran to obtain a homogeneous solution. After bubbling nitrogen for 30 minutes through the solution, 3 g of azobisisobutyronitrile was added as an initiator. The mixture was heated to 65° C. The mixture was stirred for 6 hours at this temperature. After the reaction, the reaction solution was cooled to room temperature and diluted with 50 g of tetrahydrofuran. The diluted solution was poured into 1,000 ml of n-hexane. The precipitated white powder was collected by filtration and dried to obtain a resin. This resin was a copolymer with an Mw of 13,000, containing recurring units derived from the compound of the formula (6), 2-methyl-2-adamantyl methacrylate, and methacrylic acid in the amount of 47.5 mol %, 47.5 mol %, and 5 mol % respectively. This resin is referred to as a resin (A-8).

Examples 1–12 and Comparative Example 1

Composition solutions including components shown in Table 1 were evaluated. The evaluation results are shown in Table 3.

Components other than the polymers (A-1) to (A-5) shown in Table 1 are as follows.

Other Resins a-1: t-Butyl methacrylate/methyl methacrylate/methacrylic acid copolymer (copolymerization molar ratio=40/40/20, Mw=20,000)

Acid Generator (B)

B-1: 4-n-butoxy-1-naphthyltetrahydrothiophenium nonafluoro-n-butanesulfonate

B-2: 1-(3,5-dimethyl-4-hydroxyphenyl)tetrahydrothiophenium nonafluoro-n-butanesulfonate B-3: 4-n-butoxy-1-naphthyltetrahydrothiophenium perfluoro-n-octanesulfonate Acid Generator (b)

b-1: triphenylsulfonium trifluoromethanesulfonate b-2: triphenylsulfonium nonafluoro-n-butanesulfonate b-3: bis(4-t-butylphenyl)iodonium nonafluoro-n-butanesulfonate b-4: nonafluoro-n-butanesulfonylbicyclo[2.2.1]hept-5-ene-2,3-dicarboxyimide Acid Diffusion Controller C-1: tri-n-octylamine C-2: methyldicyclohexylamine C-3: 3-pyperidino-1,2-propanediol C-4: N-t-butoxycarbonyldicyclohexylamine C-5: N-t-butoxycarbonyl-2-phenylbenzimidazole Other Additives D-1: t-butyl deoxycholate D-2: di-t-butyl 1,3-adamantanedicarboxylate D-3: t-butoxycarbonylmethyl deoxycholate Solvent E-1: 2-heptanone E-2: cyclohexanone E-3: propylene glycol monomethyl ether acetate E-4: ethyl 3-ethoxypropionate

TABLE 1

| | Resin | Acid generator | Acid diffusion controller | Other additives | Solvent |
|---|---|---|---|---|---|
| Example 1 | A-1 (100) | B-1 (2.0) b-1 (1.0) | C-1 (0.10) | | E-1 (530) |
| Example 2 | A-1 (80) A-2 (10) | B-1 (3.0) | C-4 (0.05) | D-1 (10) | E-1 (430) E-2 (100) |
| Example 3 | A-3 (95) | B-2 (2.0) b-2 (20) | C-2 (0.10) | D-2 (5) | E-1 (430) E-4 (100) |
| Example 4 | A-2 (10) A-3 (80) | B-3 (3.0) B-3 (2.0) | C-3 (0.10) | D-3 (10) | E-3 (530) |
| Example 5 | A-4 (100) | B-1 (2.0) b-4 (3.0) | C-5 (0.05) | | E-1 (530) |
| Example 6 | A-5 (90) | B-3 (2.0) b-4 (2.0) | C-5 (0.05) | D-3 (10) | E-1 (430) E-2 (100) |
| Example 7 | A-2 (10) A-5 (80) | B-2 (3.0) b-4 (2.0) | C-3 (005) C-5 (0.03) | D-2 (10) | E-3 (430) E-4 (100) |
| Example 8 | A-6 (90) | B-3 (51.1) | C-5 (0.10) | D-3 (IO) | E-3 (530) |
| Example 9 | A-7 (100) | B-2 (5.0) | C-5 (0.10) | | E-1 (530) |
| Example 10 | A-B (90) | B-3 (5.0) | C-5 (0.10) | D-3 (10) | E-3 (530) |
| Example 11 | A-7 (100) | B-2 (4.0) b-2 (1.0) | C-5 (0.10) | | E-1 (430) E-2 (100) |
| Example 12 | A-1 (90) | B-3 (5.0) | C-5 (0.10) | D-3 (10) | E-3 (530) |
| Comparative Example 1 | a-1 (90) | b-1 (2.0) | C-1 (0.05) | D-1 (10) | E-1 (530) |

Unit in parenthesis: part by weight

TABLE 2

| | Resist film thickness (μm) | Substrate | PB Temp (° C.) | PB Time (sec) | PEB Temp (° C.) | PEB Time (sec) |
|---|---|---|---|---|---|---|
| Example 1 | 0.4 | ARC | 130 | 90 | 140 | 90 |
| Example 2 | 0.4 | ARC | 130 | 90 | 140 | 90 |
| Example 3 | 0.4 | ARC | 130 | 90 | 140 | 90 |
| Example 4 | 0.4 | ARC | 130 | 90 | 140 | 90 |
| Example 5 | 0.4 | ARC | 130 | 90 | 140 | 90 |
| Example 6 | 0.4 | ARC | 130 | 90 | 140 | 90 |
| Example 7 | 0.4 | ARC | 130 | 90 | 140 | 90 |
| Example 8 | 0.4 | ARC | 130 | 90 | 140 | 90 |
| Example 9 | 0.4 | ARC | 130 | 90 | 140 | 90 |
| Example 10 | 0.4 | ARC | 130 | 90 | 140 | 90 |
| Example 11 | 0.4 | ARC | 130 | 90 | 140 | 90 |
| Example 12 | 0.4 | ARC | 130 | 90 | 140 | 90 |
| Comparative Example I | 0.4 | ARC | 130 | 90 | 140 | 90 |

TABLE 3

| | Radiation transmittance (193 nm, %) | Sensitivity (J/m²) | Resolution (μm) | Dry-etching resistance | Pattern configuration |
|---|---|---|---|---|---|
| Example 1 | 72 | 89 | 0.15 | 0.8 | Good |
| Example 2 | 74 | 95 | 0.15 | 0.6 | Good |
| Example 3 | 69 | 79 | 0.15 | 0.7 | Good |
| Example 4 | 70 | 85 | 0.15 | 0.8 | Good |
| Example 5 | 69 | 81 | 0.15 | 0.5 | Good |
| Example 6 | 73 | 86 | 0.15 | 0.7 | Good |
| Example 7 | 72 | 92 | 0.15 | 0.6 | Good |
| Example 8 | 71 | 90 | 0.15 | 0.8 | Good |
| Example 9 | 68 | 79 | 0.15 | 0.7 | Good |
| Example 10 | 71 | 90 | 0.15 | 0.8 | Good |
| Example 11 | 67 | 81 | 0.15 | 0.7 | Good |
| Example 12 | 70 | 95 | 0.14 | 0.8 | Good |
| Comparative Example 1 | 61 | 150 | 0.18 | 1.0 | Good |

The radiation-sensitive resin composition of the present invention exhibits high transparency and excellent resolution when used as a chemically-amplified resist responsive to active radiation such as deep ultraviolet rays represented by a KrF excimer laser (wavelength: 248 nm) and an ArF excimer laser (wavelength: 193 nm). The resist exhibits high resolution, excellent dry etching resistance, superior sensitivity, pattern shape, and adhesion to the substrate. The resin composition is suitably used for fabrication of integrated circuit devices which are expected to be more and more miniaturized.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:

(A) an acid-dissociable group-containing resin which is insoluble or scarcely soluble in alkali and becomes alkali soluble when the acid-dissociable group dissociates, the resin comprising the recurring unit of the following formula (1) and the recurring unit of the following formula (2),

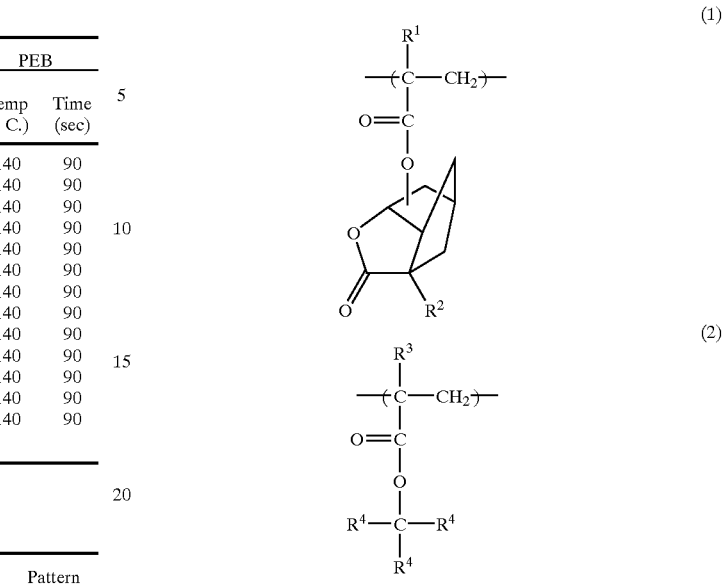

wherein $R^1$ and $R^2$ individually represent a hydrogen atom or methyl group, $R^3$ represents a hydrogen atom or methyl group, and $R^4$ individually represents a linear or branched alkyl group having 1–4 carbon atoms or a monovalent alicyclic hydrocarbon group having 4–20 carbon atoms or a derivative thereof, or any two of $R^4$ groups form in combination a divalent alicyclic hydrocarbon group having 4–20 carbon atoms or a derivative thereof, with the remaining $R^4$ group being a linear or branched alkyl group having 1–4 carbon atoms or a monovalent alicyclic hydrocarbon group having 4–20 carbon atoms or a derivative thereof, and (B) a photoacid generator of the following formula (3),

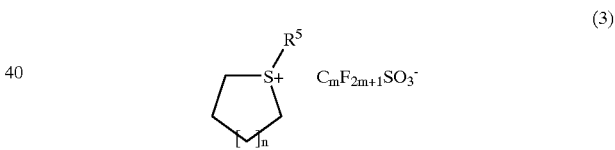

wherein $R^5$ represents a monovalent aromatic hydrocarbon group having 6–20 carbon atoms or a derivative thereof, m is an integer of 1–8, and n is an integer of 0–5.

2. The radiation-sensitive resin composition according to claim 1, wherein any two of the $R_4$ groups in the formula (2) form, in combination and together with the carbon atom with which these groups bond, a divalent alicyclic hydrocarbon group having 4–20 carbon atoms or a derivative thereof and the remaining $R^4$ group is a linear or branched alkyl group having 1–4 carbon atoms.

3. The radiation-sensitive resin composition according to claim 1, wherein $R^4$ in the formula (2) or the group formed by any two of the $R^4$ groups is an alicyclic group derived from norbornane, tricyclodecane, tetracyclododecane, or adamantane or a group in which a hydrogen atom on the aliphatic ring is replaced by an alkylene group.

4. The radiation-sensitive resin composition according to claim 1, wherein the recurring unit of the formula (2) is a recurring unit originating from 2-methyl-2-adamantyl (meth)acrylate or 2-norbornyl-2-n-propyl(meth)acrylate.

5. The radiation-sensitive resin composition according to claim 1, wherein the amount of the recurring unit of the formula (1) and the recurring unit of the formula (2) is respectively 10–80 mol % and 10–80 mol % of all recurring units in the resin (A).

6. The radiation-sensitive resin composition according to claim 1, wherein $R^5$ in the formula (3) is at least one group selected from the group consisting of a 3,5-dimethyl-4-hydrocyphenyl group, 4-methoxyphenyl group, 4-n-butoxyphenyl group, 2,4-dimethoxyphenyl group, 3,5-dimethoxyphenyl group, and 4-n-butoxy-1-naphthyl group.

7. The radiation-sensitive resin composition according to claim 1, wherein m in the formula (3) is 4 or 8.

8. The radiation-sensitive resin composition according to claim 1, wherein n in the formula (3) is 1.

9. The radiation-sensitive resin composition according to claim 1, further comprising a photoacid generator other than the photoacid generator (B) of the formula (3).

10. The radiation-sensitive resin composition according to claim 9, wherein the amount of the photoacid generator other than the photoacid generator (B) is 80 wt % or less of the total amount of the photoacid generators.

11. The radiation-sensitive resin composition according to claim 1, further comprising an acid diffusion controller.

12. The radiation-sensitive resin composition according to claim 11, wherein the acid diffusion controller is a nitrogen-containing organic compound.

13. The radiation-sensitive resin composition according to claim 1, further comprising an alicyclic additive having an acid-dissociable group.

14. The radiation-sensitive resin composition according to claim 1, further comprising a linear or branched ketone, cyclic ketone, propylene glycol monoalkyl ether acetate, alkyl 2-hydrocypropionate, or alkyl 3-alkoxypropionate as a solvent.

* * * * *